United States Patent [19]
Noguchi et al.

[11] Patent Number: 6,020,601
[45] Date of Patent: Feb. 1, 2000

[54] SEMICONDUCTOR LIGHT-EMITTING DEVICE

[75] Inventors: Hiroyasu Noguchi; Eisaku Kato; Masaharu Nagai, all of Kanagawa, Japan

[73] Assignee: Sony Corporation, Tokyo, Japan

[21] Appl. No.: 09/189,679

[22] Filed: Nov. 13, 1998

[30] Foreign Application Priority Data

Nov. 14, 1997  [JP]  Japan .............................. PO9-314073

[51] Int. Cl.$^7$ .................................................. H01L 33/00

[52] U.S. Cl. .............................. 257/96; 257/13; 257/14; 257/94

[58] Field of Search ................................ 257/13, 14, 94, 257/96

[56] References Cited

U.S. PATENT DOCUMENTS 5,663,514  9/1997  Shiraishi et al. ........................ 257/94

Primary Examiner—Olik Chaudhuri
Assistant Examiner—Douglas A. Wille
Attorney, Agent, or Firm—Hill & Simpson

[57] ABSTRACT

A semiconductor light-emitting device longer in life time and higher in reliability is provided which is formed of, on a substrate (1), a first conductivity type cladding layer (3) and a second conductivity type cladding layer (7) made of $Zn_xMg_YBe_{1-x-y}S_ZSe_{1-z}$ (0<x<1, 0<y<1, 0≦z<1) system compound semiconductor, at least one active layer (5) made of $Zn_ACd_BBe_{1-A-B}S_c Se_{1-C}$ (0<A≦1, 0≦B<1, 0≦C<1), having a compressive distortion relative to the above substrate and located between the first and second conductivity type cladding layers, and at least one strain compensation layer having a tensile distortion relative to the above substrate and made of $Zn_u Cd_{1-u} S_vSe_{1-v}$ (0<u≦1, 0≦v<1).

3 Claims, 3 Drawing Sheets

SEMICONDUCTOR LIGHT-EMITTING DEVICE

BACKGROUND OF THE INVENTION

1. Field of the Invention

The present invention relates to a semiconductor light-emitting device, and particularly to a II–VI compound semiconductor light-emitting device which emits lights from green to blue colors.

2. Description of the Related Art

Recently, study and development to improve the property of a semiconductor laser using a strained quantum well have become brisk. As the semiconductor laser using the strained quantum well, there are developed a III–V system semiconductor laser or an AlGaInP system semiconductor laser emitting a light with a wavelength of 600 nm band, an InGaAsP system semiconductor laser emitting a light with a wavelength of 1 $\mu$m band, an InGaAsP system semiconductor laser emitting a light with a wavelength of 1.3 to 1.5 $\mu$m band, and so on.

The strained quantum well has two kinds of type, one of which is of a strain caused by compression and the other of which is of strain caused by tension. In general, the strained quantum well is gripped by barrier layers of lattice matching system.

As disclosed in Patent Application laid open Ser. No. 8-18161, since a II–VI family compound semiconductor light-emitting device having an active region of quantum well structure has an active region of a quantum well structure by at least one quantum well layer having a compressive strain relative to a substrate and made of ZnCdSSe and at least one barrier layer having a tensile strain relative to a substrate and made of ZnSSe, the breeding speed of crystal defect is suppressed, the life time of the device may be extended, and further the thickness of strained quantum well layer is made thick sufficiently without being restricted by the critical film thickness of the strained quantum well layer, whereby a II–VI compound semiconductor light-emitting device, which can confine the light sufficiently and is high in reliability, is proposed.

SUMMARY OF THE INVENTION

It is an object of the present invention to provide a semiconductor light-emitting device which has a longer life time and a higher reliability as compared with the semiconductor light-emitting device disclosed in the above-mentioned Patent Application laid open Ser. No. 8-18161.

According to an aspect of the present invention, there is provided a semiconductor light-emitting device which has, on a substrate, a first conductivity type cladding layer and a second conductivity type cladding layer each being made of $Zn_xMg_yBe_{1-x-y}S_zSe_{1-z}$ (0<x<1, 0<y<1, 0<z<1) system compound semiconductor, at least one active layer having a quantum well layer with a compressive strain relative to the above-mentioned substrate, formed of $Zn_ACd_BBe_{1-A-B}S_CSe_{1-C}$ (1<A$\leq$1, 0$\leq$B<1, 0$\leq$C<1) and located between the first and second conductivity type cladding layers, and at least one strain compensation layer having a tensile strain relative to the above-mentioned substrate and formed of $Zn_uCd_{1-u}S_vSe_{1-v}$ (0<u$\leq$1, 0$\leq$v<1).

When the following definitions are satisfied $$S_T = (\Sigma d_{QW}\acute{O}_{QW} + 4\Sigma d_{sc}\acute{O}_{sc})/\Sigma(d_{QW} + d_{sc})$$

$$\acute{O}_{QW}(a_{QW} = (a_{QW} - a_{sub})$$

$$\acute{O}_{sc} = (a_{sc} - a_{sub})$$

($d_{QW}$ is the thickness of each quantum well of an active layer, $d_{sc}$ is the thickness of each strain compensation layer, $a_{QW}$ is the lattice constant of the above-mentioned quantum well layer, $a_{sub}$ is the lattice constant of the above-mentioned substrate, and $a_{sc}$ is the lattice constant of the above-mentioned strain compensation layer), the strain compensation layer is arranged such that the value of $S_T$ is selected to satisfy the condition of $-0.015 < S_T < +0.015$.

According to the semiconductor light-emitting device with the above arrangement, there are appreciated a higher reliability and a longer life span.

In other words, in the conventional technique, the degree of strain compensation for the layer containing the compressive strain and the tensile strain is defined as a product of the lattice strain and the thickness of the layer. As to this product, a value $\epsilon$ of a ratio between the respective products of the compressive strain layer and the tensile strain layer is restricted.

However, in the value there is no consideration about the elastic constant of each of the compressive strain layer and the tensile strain layer, and also there is no consideration of the fact that the stress becomes large for change of lattice constant generated by the compressive or tensile strain in each layer.

The present invention is made in view the above aspect and balances a stress applied to whole the compressive distortion layer and a stress applied to the tensile distortion layer as a whole.

Specifically, since the value of a product of a change (strain amount) of lattice constant of each layer and the elastic constant thereof could be considered as a value proportional to the stress applied to each layer, if the respective layers are designed in such a manner that such stresses become zero as a whole for the active layer and the strain compensation layer to which the compressive distortion and the tensile distortion are applied, a layer structure with most balance stress as a whole can be obtained. Therefore, a device with a longer life stance can be made.

The elastic constant $1/(S_{11}+S_{12})$ of each material is 7.69 for ZnSe ; 8.77 for ZnS ; and 6.40 for CdSe. As to a mixed crystal of the above material, it may be considered that by considering the composition of mixed crystal, the elastic constant thereof is in proportion to the composition and then obtained. However, the elastic constant of mixed crystal of the above materials is not always proportional to the composition of each mixed crystal in fact. It is confirmed that when the ratio between such constants of the active layer and the strain compensation layer is set to 4, the laser life time becomes a relative maximum near the value of $S_T$ being 0.

DESCRIPTION OF THE PREFERRED EMBODIMENTS

An embodiment of the semiconductor light-emitting device according to the present invention will be described.

As described above, a semiconductor light-emitting device according to the present invention has, on a substrate, a first conductivity type cladding layer and a second conductivity type cladding layer each being made of $Zn_xMg_yBe_{1-x-y}S_zSe_{1-z}$ (0<x<1, 0<y<1, 0≦z<1) system compound semiconductor, at least one active layer having a quantum well layer with a compressive distortion relative to the above-mentioned substrate, formed of $Zn_A Cd_B Be_{1-A-B}S_C Se_{1-c}$ (0<A≦1, 0≦B<1, 0≦C<1) and located between the first and second conductivity type cladding layers, and at least one strain compensation layer having a tensile distortion relative to the above-mentioned substrate and formed of $Zn_uCd_{1-u}S_vSe_{1-v}$ (0<u≦1, 0≦v<1).

When the following definitions are satisfied $$S_T = (\Sigma d_{QW}\sigma_{QW} + 4\Sigma d_{sc}\sigma_{sc})/\Sigma(d_{QW}+d_{sc})$$

where $$\acute{o}_{QW} = (a_{QW}-a_{sub})/a_{sub}$$

$$\acute{o}_{sc} = (a_{sc}-a_{sub})/a_{sub}$$

($a_{QW}$ is the lattice constant of the above-mentioned quantum well layer, $a_{sub}$ is the lattice constant of the above-mentioned substrate, and $a_{sc}$ is the lattice constant of the above-mentioned strain compensation layer), the strain compensation layer is arranged such that the value of $S_T$ is selected to satisfy the condition of $-0.015 < S_T < +.0.015$.

An example of the semiconductor light-emitting device according to the present invention will be described with reference to FIG. 1.

Figure 1:
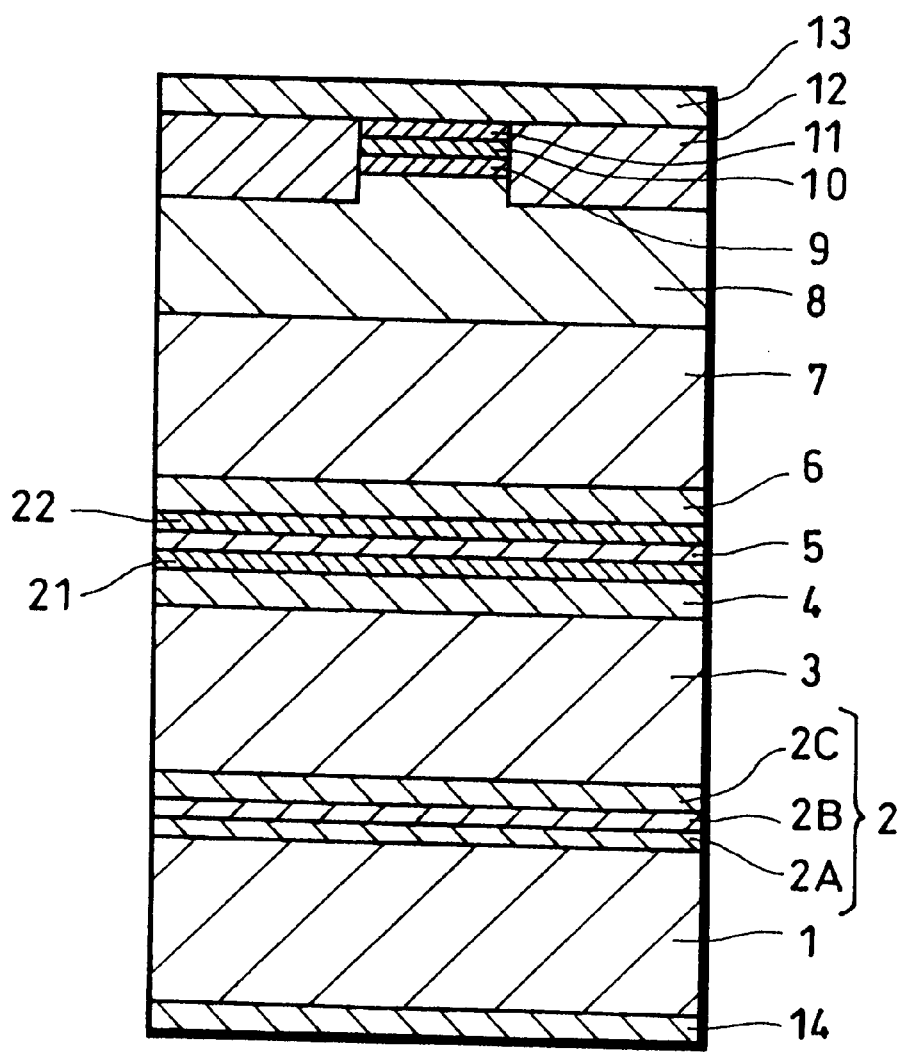
FIG. 1 is a schematic cross-sectional diagram showing an example of the semiconductor light-emitting device according to the present invention.

FIG. 1 is a schematic cross-sectional view showing a blue semiconductor laser made of a II–VI compound semiconductor as a semiconductor light-emitting device according to the present invention.

In this example, while first and second strain compensation layers 21 and 22 are disposed to grip therebetween an active layer 5 of a single quantum well structure, it may be possible to locate the strain compensation layer only one side. Also, the active layer 5 is not limited to the single quantum well structure but may be formed of a multiple quantum well structure. Besides, the semiconductor light-emitting device according to the present invention is not limited to the example shown in FIG. 1.

In the example shown in FIG. 1, on a substrate 1 of a first conductivity type, for example, an n-type, epitaxially grown sequentially by, for example, a molecular beam epitaxy method are a first conductivity type buffer layer 2, a first conductivity type cladding layer 3, a first guide layer 4, the first strain compensation layer 21, the active layer 5 of quantum well structure, the second strain compensation layer 22, a second guide layer 6, a second conductivity type, for example, p-type cladding layer 7, a second conductivity type first semiconductor layer 8, a second conductivity type second semiconductor layer 9, a second conductivity type superlattice layer 10, and a second conductivity type contact layer 11.

A mesa groove is formed by etching to cross the contact layer 11 and the superlattice layer 10 of laminated semiconductor layer which are epitaxially grown in the width direction on both sides of a stripe-shaped current path to grip it therebetween. An insulating layer 12 made of $Al_2O_3$ or the like is buried in the mesa grooves.

One electrode 13 is deposited on the contact layer 11 in an ohmic contact fashion and the other electrode 14 is deposited on the rear surface of the substrate 1 in an ohmic contact manner.

The substrate 1 has a thickness of, for example, 100 to 350 $\mu$m and is made of an n-type GaAs added with silicon (Si) as an n-type impurity.

The buffer layer 2 is formed of a buffer layer 2A made of, for example, a III–V compound semiconductor, and first and second buffer layers 2B and 2C made of first and second II–VI compound semiconductors. The buffer layer 2A has a thickness of 200 nm in the growth direction (hereinafter, simply referred to as a thickness) and is made of an n-type GaAs added with silicon as the n-type impurity, the first II–VI buffer layer 2B has a thickness of, for example, 20 nm and is made of an n-type ZnSe added with chlorine (Cl) as the n-type impurity, and the second II–VI buffer layer 2C is, for example, 200 nm in thickness and made of an n-type ZnSSe added with chlorine (Cl) as the n-type impurity.

The first conductivity type cladding layer 3 is, for example, 1 $\mu$m in thickness and made of an n-type ZnMgSSe mixed crystal added with chlorine as the n-type impurity.

The first guide layer 4 is, for example, 100 nm in thickness and made of ZnSSe mixed crystal added with chlorine as the n-type impurity or with no element, namely non-dope. The composition ratio of the column VI elements of ZnSSe mixed crystal forming the guide layer 4 is, for example, 6% of S (sulfur) and 94% of Se (selenium).

The active layer 5 is, for example, 3.3 nm in thickness and made of ZnCdSe mixed crystal of a single quantum well structure. The composition ratio of the column II elements is, for example, 67% of zinc and 33% of cadmium. The lattice constant thereof is little larger than the lattice constant ask (lattice constant of GaAs) of substrate 1.

The second guide layer 6 is, for example, 100 nm in thickness and made of ZnSSe mixed crystal added with nitrogen (N) as a p-type impurity or no element. The composition ratio of the VI family elements of ZnSSe mixed crystal forming the guide layer 6 is 6% of sulfur and 94% of selenium.

The second conductivity type cladding layer 7 is, for example, 1 $\mu$m in thickness and made of the p-type ZnMgSSe mixed crystal added with nitrogen as the p-type impurity.

The first semiconductor layer 8 is, for example, 2 $\mu$m in thickness and made of the p-type ZnSSe mixed crystal added with nitrogen as the p-type impurity.

The second semiconductor layer 9 is, for example, 100 nm in thickness and made of the p-type ZnSe added with nitrogen as the p-type impurity.

The superlattice layer 10 thereon is made of a superlattice layer in which, for example, a p-type ZnSe layer and a p-type ZnTe layer are grown one on another.

The contact layer 11 is formed of, for example, a p-type ZnTe layer with the thickness of 50 nm.

In the first and second strain compensation layers 21 and 22, the value of $S_T$ is selected to satisfy the condition of $-0.015 < S_T < 0.015$. The first strain compensation layer 21 is made as the first conductivity type, for example, n-type or non-dope, and the second strain compensation layer 22 is made as the second conductivity type, for example, p-type or non-dope. Each of the first and second strain compensation layers 21 and 22 is made of ZnSSe mixed crystal with the thickness of, for example. 7.4 nm in which the composition ratio of the VI family elements is 21% of S and 79% of Se.

An MBE apparatus for practicing the above-mentioned MBE method is such an apparatus which uses a valved cracking cell as a molecular beam source for each of S and Se.

A pattern etching is effected on the grown semiconductor layer thus made by a photo-lithography to remain a stripe-shaped pattern and a mesa groove is formed on the both sides of the stripe-shaped pattern. In other words, a photo-resist is coated on the contact layer 11, subjected to a pattern exposing process, and to a developing process to thereby form a stripe-shaped photoresist layer with the width of, for example, 10 μm. While using this photoresist layer as an etching mask, an etching is carried out by, for example, etchant to a depth crossing the contact layer 11 and the superlattice layer 10 as shown in FIG. 1 or, though not shown, to a depth reaching the second conductivity type cladding layer 7.

Thereafter, for example, alumina ($Al_2O_3$) or the like is vapor-deposited thereon to form the insulating layer 12. Then, the resist layer on the surface thereof is removed and the electrode 13, in this example, p-side electrode 13 is vapor-deposited thereon. This electrode 13 is formed in such a manner that, for example, a titanium (Ti) of 10 nm thick and a gold (Au) of 300 nm thick are sequentially laminated. Also, on the rear surface of the substrate 1, there is formed the electrode 14 made of indium (IN), in this example, the n-side electrode 14.

Figure 2:
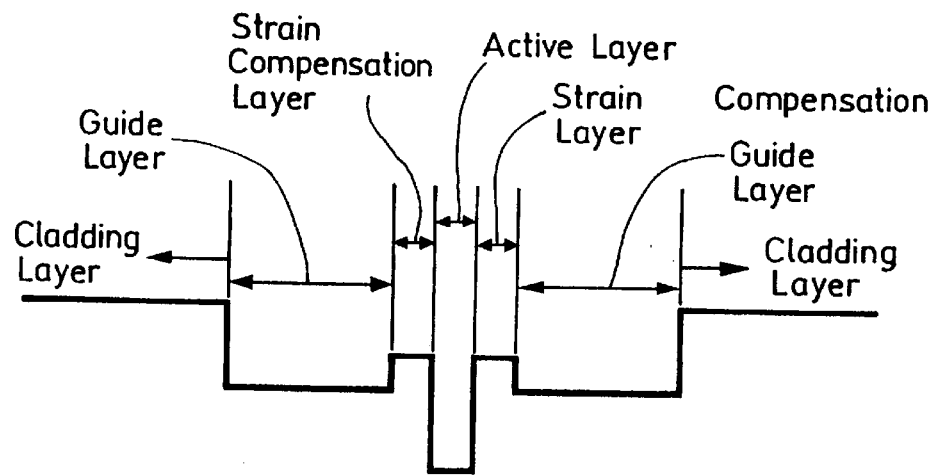
FIG. 2 is a diagram showing an energy band model of the device according to the present invention near its active layer.

FIG. 2 shows the conduction band of an energy band model near the active layer of the semiconductor light-emitting device according to the present invention. According to the above-mentioned semiconductor light-emitting device of the present invention, there is made a semiconductor light-emitting device long in life span and superior in reliability.

The technique, which provides the ZnSSe strain compensation layer rich in, for example, S on the both sides of the active layer to grip it therebetween to cancel the strain thereof and to reduce the strain energy of the active layer (including its neighboring portion), was considered important in order to improve the life time of active layer and hence the life time of the semiconductor light-emitting device remarkably. However, it has not yet been developed to optimize such technique. The present invention optimizes the technique.

Figure 3:
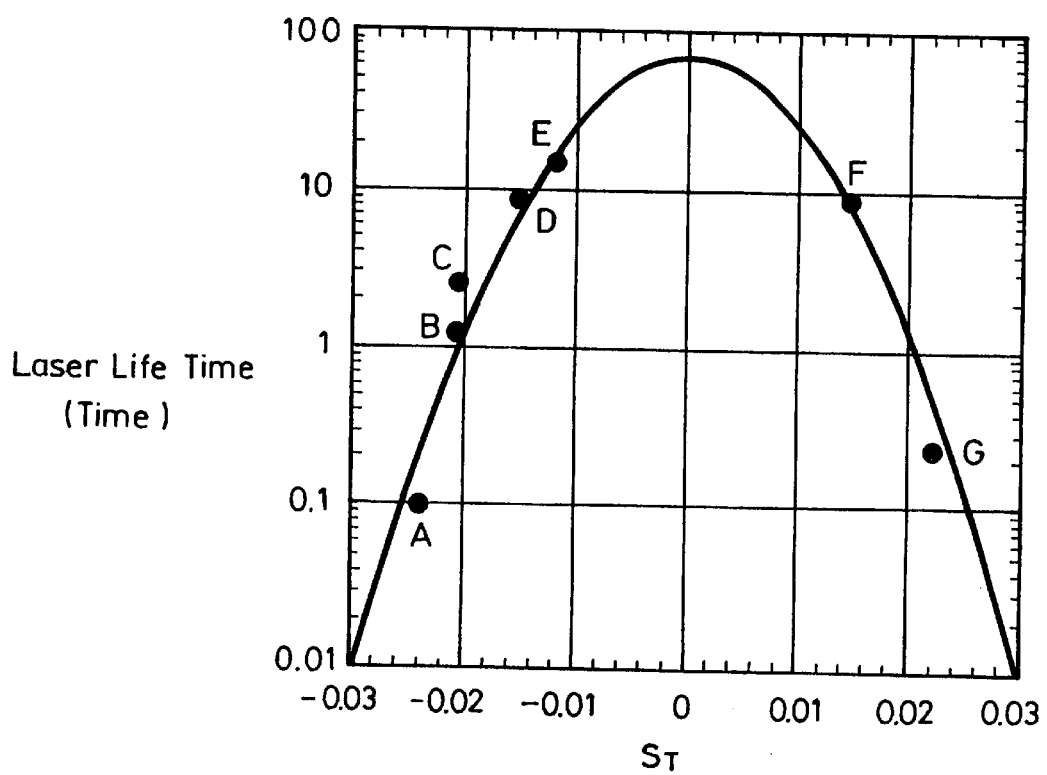
FIG. 3 is a graph showing measured results of the relation of $S_T$ value to a life time.

FIG. 3 is a graph shows the measured result of the relation between the $S_T$ value in the strain compensation layer and the life time of the semiconductor light-emitting device. In the graph of FIG. 3, respective points A to G are obtained by plotting the measured results relating to respective samples. A to G in the following table 1. In this measurement, the S composition in the ZnSSe of the strain compensation layer is selected as 21% and the Cd composition in the ZnCdSe of the active layer is selected in the range of 32% to 35%.

As to the other layers, the composition ratio of the Column II and Column VI element(s) is selected to a value matched with the GaAs substrate.

TABLE 1

| Sample | Strain Compensation Layer | | Active Layer | | $S_T$ |
|---|---|---|---|---|---|
| | Film Thickness (n m) | S (sulfur) Composition (%) | Film Thickness (n m) | Cd Composition (%) | |
| A | 40 | 21 | 3.3 | 32 | −0.0240 |
| B | 20 | 21 | 3.3 | 32 | −0.0201 |
| C | 20 | 21 | 3.0 | 34.5 | −0.0206 |
| D | 10 | 21 | 3.3 | 32 | −0.0153 |
| E | 7.4 | 21 | 3.3 | 34 | −0.0116 |
| F | 4.8 | 21 | 4.6 | 27 | +0.0150 |
| G | 0 | 0 | 4.6 | 27 | −0.0220 |

From the graph of FIG. 3, it is understood that the life time is extended with the $S_T$ value of −0.015 to +0.015. According to the semiconductor laser of the present invention, under the light output of 1 mW, a continuous wave operation more than 300 hours at the room temperature is realized and the reliability of the semiconductor laser of the present invention is improved remarkably as compared with the conventional II–VI compound semiconductor laser. The extension of life time is more than 100 times as compared with the invention disclosed in the above-mentioned patent application laid open Ser. No. 8-18161.

The lattice constant (Å) of each mixed crystal is shown in the following table 2.

TABLE 2

| Material | Lattice Constant (Å) |
|---|---|
| ZnSe | 5.668 |
| ZnS | 5.409 |
| CdSe | 6.077 |
| GaAs | 5.653 |

In the example described above, while the active layer is made of ZnCdSe in the semiconductor light-emitting device with the cladding layer made of ZnMgSSe system, the active layer may be made of ZnCdSSe. Also, the present invention is not limited to the above example, it is possible that the present invention is applied to, for example, a semiconductor light-emitting device made of the semiconductor light-emitting device with the cladding layer made of ZnMgBeSe system with the similar effect.

Figure 4:
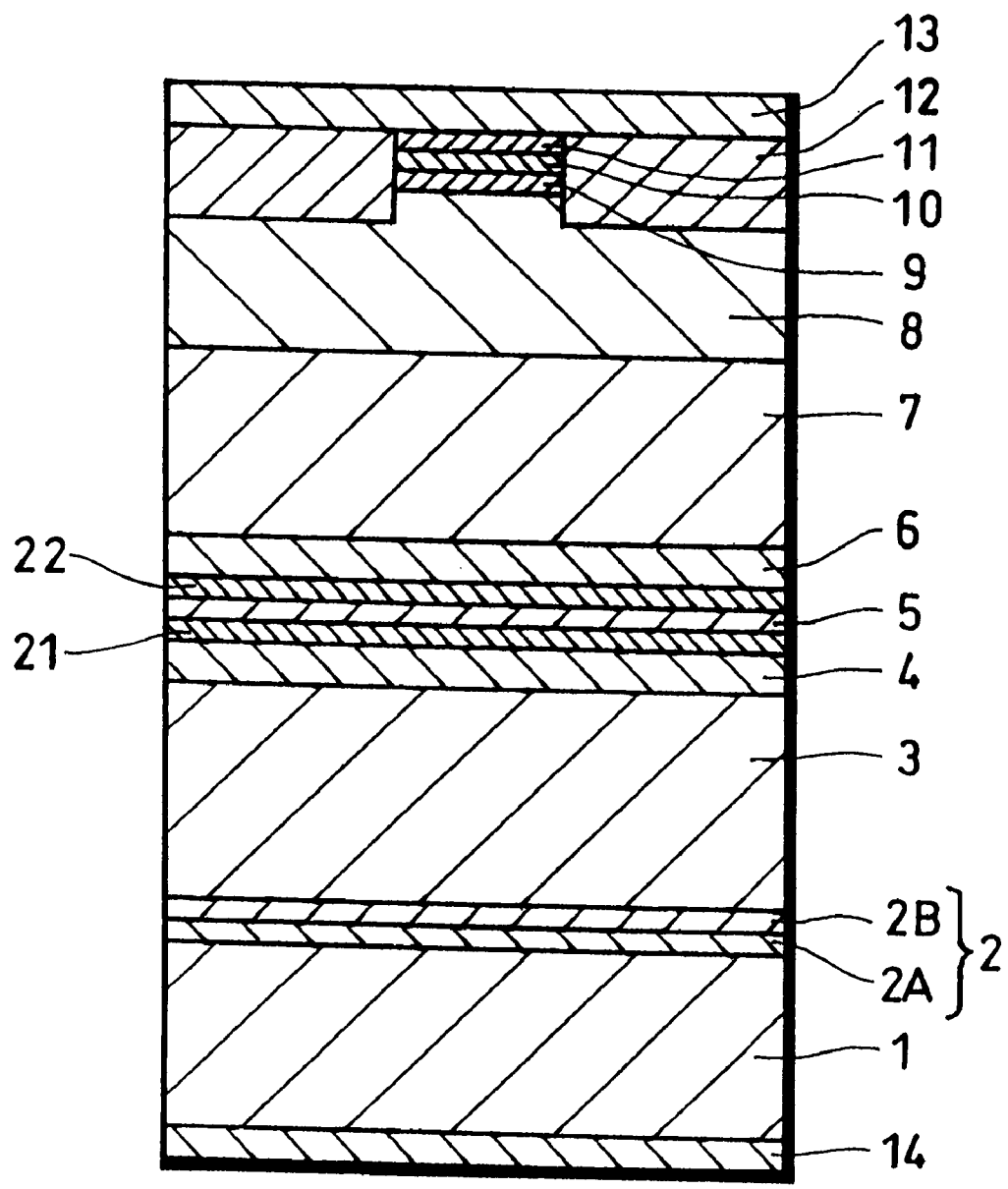
FIG. 4 is a schematic cross-sectional view showing another example of the semiconductor light-emitting device according to the present invention.

FIG. 4 shows an example of the above case. In this example, on a GaAs substrate 1 of a first conductivity type, for example, an n-type, epitaxially-grown sequentially by, for example, the MBE are a first conductivity type buffer layer 2, a first conductivity type cladding layer 3, a first guide layer 4, a first strain compensation layer 21, an active layer 5 of quantum well structure, a second strain compensation layer 22, a second guide layer 6, a second conductivity type for example, p-type cladding layer 7, a second conductivity type first semiconductor layer 8, a second conductivity type second semiconductor layer 9, a second conductivity type superlattice layer 10, and a second conductivity type contact layer 11. Then, a mesa groove is formed by etching to cross the contact layer 11 and the superlattice layer 10 in the width direction on both sides of a stripe-shaped current path to grip it therebetween. An insulating layer 12 made of $Al_2O_3$ or the like is buried in the mesa grooves.

Then, one electrode 13 is deposited on the contact layer 11 in an ohmic contact manner, and the other electrode 14 is deposited on the rear surface of the substrate 1 in an ohmic contact fashion.

In the example shown in FIG. 4, the MBE apparatus for carrying out the MBE method uses an apparatus in which a valved cracking cell is employed as a molecular beam source for each of S and Se, too.

In the example shown in FIG. 4, the buffer layer 2 is formed of a buffer layer 2A made of, for example, III–V compound semiconductor GaAs and one buffer layer 2B made of II–VI compound semiconductor ZnBeSe in this example.

The first conductivity type cladding layer 3 is made of n-type ZnMgBeSe mixed crystal having a thickness of 1 μm, for example.

The first guide layer 4 is made of n-type or non-dope ZnBeSe mixed crystal with a thickness of 100 nm, for example.

The active layer 5 is made of ZnCdSe mixed crystal of a single quantum well structure or ZnCdBeSe mixed crystal with the thickness of 3.3 nm, for example. In this case, the lattice constant thereof is little larger than the lattice constant of substrate 1 (lattice constant of GaAs).

The second guide layer 6 is made of p-type or non-dope ZnBeSe mixed crystal with the thickness of 100 nm, for example.

The second conductivity type cladding layer 7 is made of, for example, p-type ZnMgBeSe mixed crystal with the thickness of 1 μm.

The first semiconductor layer 8 is made of,for example, p-type ZnBeSe mixed crystal with the thickness of 2 μm.

The second semiconductor layer 9 is made of, for example, p-type ZnSe with the thickness of 100 nm.

The superlattic layer 10 thereon is made of a superlattic layer in which, for example, a p-type ZnSe layer and a p-type BeTe layer are grown.

The contact layer 11 is made of a p-type BeTe layer with the thickness of 50 nm, for example.

Also, in this case, the first and second strain compensation layers 21 and 22 have the value of $S_T$ mentioned above which is selected to satisfy the condition of $-0.015 < S_T < 0.015$. The first strain compensation layer 21 is made to be of the first conductivity type, for example, n-type or non-dope and the second strain compensation layer 22 is made to be of the second conductivity type, for example, p-type or non-dope.

While in the respective examples mentioned above, the active layer is of the single quantum well structure, it is possible that the present invention is applied to a semiconductor light-emitting device with the multiple quantum well structure with the same effect. In this case,its barrier layer may be made same in composition as that of the strain compensation layer.

Further, while the substrate 1 is made of GaAs in the above examples, a substrate made of ZnSe or the like may be used.

As described above, according to the structure of the present invention, although the strain compensation layer is provided, this strain compensation layer is not only to merely remove the strain caused by the mismatch between the substrate and the active layer, but also the life time of the semiconductor light-emitting device is extended by the specific structure.

As described above, according to the structure of the present invention, the semiconductor light-emitting device can be extended in its life time and hence improved in its reliability which can not be appreciated by the conventional semiconductor light-emitting device, for example, a laser or light-emitting diode.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A semiconductor light-emitting device, comprising:
    a substrate;
    a first conductivity type cladding layer and a second conductivity type cladding layer each being made of $Zn_xMg_yBe_{1-x-y}S_zSe_{1-z}$ ($0<x<1$, $0<y<1$, $0 \leq z<1$) system compound semiconductor, on said substrate;
    at least one active layer having a quantum well layer having a compressive distortion relative to said substrate and formed of $Zn_ACd_BBe_{1-A-B}Se_CS_{1-c}$ ($0<A \leq 1$, $0 \leq B<1$, $0 \leq C<1$) and located between said first and second conductivity type cladding layers; and
    at least one strain compensation layer having a tensile distortion relative to said substrate and made of $Zn_u Cd_{1-u} S_v Se_{1-v}$ ($0<u \leq 1$, $0 \leq 1$),
    wherein when $$S_T = (\Sigma d_{QW} \acute{O}_{QW} + 4\Sigma d_{sc} \acute{O}_{sc})/\Sigma(d_{QW}+d_{sc})$$

is defined, and $$\acute{O}_{QW} = (a_{QW}-a_{sub})/a_{sub}$$

$$\acute{O}_{sc} = (a_{sc}-a_{sub})/a_{sub}$$

(where $d_{QW}$ is a thickness of each quantum well layer of the action layer, $d_{sc}$ is a thickness of each strain compensation layer, $a_{QW}$ is a lattice constant of said quantum well layer, $a_{sub}$ is a lattice constant of said substrate, and $a_{sc}$ is a lattice constant of said strain compensation layer) are defined, said strain compensation layer is arranged such that the value of $S_T$ is selected to satisfy a condition of $-0.015<S_T<+0.015$.

2. A semiconductor light-emitting device as claimed in claim 1, wherein said active layer is of a single quantum well structure.

3. A semiconductor light-emitting device as claimed in claim 1, wherein said active layer is of a multiple quantum well structure.

* * * * *